United States Patent
Beck et al.

(10) Patent No.: US 10,692,655 B2
(45) Date of Patent: Jun. 23, 2020

(54) FILTER COMPONENT FOR FILTERING AN INTERFERENCE SIGNAL

(71) Applicant: TDK Electronics AG, München (DE)

(72) Inventors: Fabian Beck, Rüttenen (CH); Florian Böhm, Ulm (DE); Jürgen Konrad, Graz (AT); Markus Koini, Seiersberg (AT)

(73) Assignee: TDK Electronics AG, München (DE)

( * ) Notice: Subject to any disclaimer, the term of this patent is extended or adjusted under 35 U.S.C. 154(b) by 0 days.

(21) Appl. No.: 16/308,224

(22) PCT Filed: Jun. 12, 2017

(86) PCT No.: PCT/EP2017/064298
§ 371 (c)(1),
(2) Date: Dec. 7, 2018

(87) PCT Pub. No.: WO2017/212070
PCT Pub. Date: Dec. 14, 2017

(65) Prior Publication Data
US 2019/0267193 A1    Aug. 29, 2019

(30) Foreign Application Priority Data

Jun. 10, 2016   (DE) ...................... 10 2016 110 742

(51) Int. Cl.
*H01G 2/00* (2006.01)
*H01G 2/06* (2006.01)
(Continued)

(52) U.S. Cl.
CPC ............... *H01G 4/30* (2013.01); *H01G 4/005* (2013.01); *H01G 4/1245* (2013.01);
(Continued)

(58) Field of Classification Search
CPC .. H01G 2/00; H01G 2/06; H01G 4/05; H01G 4/08; H01G 4/12; H01G 4/30; H01G 4/228; H01G 4/232; H01C 7/00
(Continued)

(56) References Cited

U.S. PATENT DOCUMENTS 4,219,866 A    8/1980   Maher
4,906,512 A *  3/1990   Roess .................... H01G 4/302
                                              156/89.17

(Continued)

FOREIGN PATENT DOCUMENTS

CN    104425126 A    3/2015
CN    104781894 A    7/2015
(Continued)

OTHER PUBLICATIONS

TDK, "CeraLink capacitor for fast-switching semiconductors," dated Feb. 18, 2016 (19 pages).

*Primary Examiner* — Xiaoliang Chen
(74) *Attorney, Agent, or Firm* — Nixon Peabody LLP (57) ABSTRACT

A filter component for filtering an interference signal. The filter component includes at least one multilayer ceramic capacitor having a main body, in which multiple ceramic layers and internal electrodes are stacked one above another, and connection contacts are arranged at the main body. The ceramic layers include a lead lanthanum zirconate titanate ceramic, for example.

15 Claims, 6 Drawing Sheets

(51) Int. Cl.
  *H01G 4/08*    (2006.01)
  *H01G 4/12*    (2006.01)
  *H01G 4/30*    (2006.01)
  *H01G 4/228*   (2006.01)
  *H01G 4/232*   (2006.01)
  *H01C 7/00*    (2006.01)
  *H01G 4/005*   (2006.01)
  *H03H 1/00*    (2006.01)
  *H05K 1/18*    (2006.01)

(52) U.S. Cl.
  CPC .............. *H01G 4/232* (2013.01); *H03H 1/00* (2013.01); *H03H 1/0007* (2013.01); *H05K 1/181* (2013.01); *H03H 2001/0014* (2013.01); *H03H 2001/0085* (2013.01); *H05K 2201/1006* (2013.01); *H05K 2201/10015* (2013.01); *H05K 2201/10272* (2013.01)

(58) Field of Classification Search
  USPC ........ 174/260, 250, 261, 262, 520; 361/303, 361/305, 321.4, 321.5, 308.1, 301.4, 767; 428/192
  See application file for complete search history.

(56) References Cited

U.S. PATENT DOCUMENTS

| | | | | |
|---|---|---|---|---|
| 5,027,264 A * | 6/1991 | DeDoncker | ....... | H02M 3/33584 363/129 |
| 5,112,433 A * | 5/1992 | Dawson | .............. | C04B 35/4682 252/62.9 R |
| 5,263,247 A * | 11/1993 | Adachi | ................... | F16B 19/10 29/525.05 |
| 5,323,303 A * | 6/1994 | Dolland | .................... | H02J 1/02 333/181 |
| 5,337,209 A * | 8/1994 | Sutherland | ............ | C04B 35/499 361/321.5 |
| 5,442,142 A * | 8/1995 | Hayashi | ................ | H05K 1/0263 174/250 |
| 5,545,184 A * | 8/1996 | Dougherty | ............ | A61N 1/3956 607/5 |
| 5,728,138 A * | 3/1998 | Dougherty | ............ | A61N 1/3956 361/313 |
| 6,081,416 A * | 6/2000 | Trinh | ........................ | H01G 4/12 361/308.1 |
| 6,104,143 A * | 8/2000 | Bonavia | ................ | F02P 3/0884 315/209 CD |
| 6,201,683 B1 | 3/2001 | Yamada et al. | | |
| 7,884,042 B2 * | 2/2011 | Hackenberger | ....... | C04B 35/493 501/134 |
| 9,293,256 B2 | 3/2016 | Engel | | |
| 9,355,210 B2 * | 5/2016 | Hidaka | ............... | G06F 17/5036 |
| 9,786,437 B1 * | 10/2017 | Trinh | ..................... | H01G 4/232 |
| 9,949,378 B2 * | 4/2018 | Trinh | ..................... | H01G 2/06 |
| 2005/0041367 A1 * | 2/2005 | Yoshii | ................... | H01G 2/065 361/303 |
| 2006/0145401 A1 * | 7/2006 | Mihara | .................. | H01C 1/148 264/618 |
| 2007/0145919 A1 * | 6/2007 | Hamaoka | .................. | H02P 6/16 318/400.34 |
| 2008/0026136 A1 * | 1/2008 | Skamser | ............. | C04B 35/4682 427/79 |
| 2008/0026929 A1 * | 1/2008 | Jensen | ................... | B82Y 30/00 501/87 |
| 2008/0242532 A1 * | 10/2008 | Nishikawa | .......... | C04B 35/4682 501/138 |
| 2009/0128989 A1 * | 5/2009 | Suzuki | ................ | C01G 23/002 361/321.4 |
| 2009/0207555 A1 * | 8/2009 | Hackenberger | ........ | C04B 35/493 361/321.5 |
| 2009/0309650 A1 * | 12/2009 | Fujita | .................... | H02M 3/073 327/589 |
| 2010/0110608 A1 * | 5/2010 | Wei | ..................... | C04B 35/4682 361/321.4 |
| 2010/0123995 A1 * | 5/2010 | Otsuka | ..................... | H01G 2/06 361/308.1 |
| 2010/0209804 A1 | 5/2010 | Feichtinger | | |
| 2010/0254067 A1 * | 10/2010 | Wei | .......................... | H01G 2/08 361/274.2 |
| 2010/0279844 A1 * | 11/2010 | Hackenberger | ........ | C04B 35/493 501/32 |
| 2011/0226524 A1 * | 9/2011 | Hagiwara | ............ | H05K 5/0026 174/520 |
| 2012/0099241 A1 * | 4/2012 | Chang | .................... | H01G 4/012 361/301.4 |
| 2012/0262838 A1 * | 10/2012 | Otsuka | .................... | H01G 2/06 361/306.1 |
| 2013/0049814 A1 * | 2/2013 | De Rooij | ............ | H01L 27/0207 327/108 |
| 2013/0107419 A1 * | 5/2013 | Hill | ........................ | H01G 4/008 361/305 |
| 2013/0332010 A1 * | 12/2013 | Ziarno | ............... | G05B 23/0213 701/3 |
| 2013/0332011 A1 * | 12/2013 | Ziarno | ............... | G05B 23/0213 701/3 |
| 2013/0332025 A1 * | 12/2013 | Ziarno | ............... | G05B 23/0213 701/33.4 |
| 2013/0343027 A1 * | 12/2013 | Perea | ........................ | H01C 1/14 361/813 |
| 2014/0114549 A1 * | 4/2014 | Ziarno | ............... | G05B 23/0213 701/100 |
| 2014/0123453 A1 * | 5/2014 | Perea | ........................ | H01C 1/14 29/25.41 |
| 2014/0375211 A1 * | 12/2014 | Herrador | ............ | H05B 33/0809 315/119 |
| 2015/0054388 A1 * | 2/2015 | Itagaki | ................... | H01C 7/008 310/364 |
| 2015/0103466 A1 | 4/2015 | Engel et al. | | |
| 2015/0136463 A1 * | 5/2015 | Lee | ........................ | H01G 4/005 174/260 |
| 2015/0146343 A1 * | 5/2015 | Ellmore | ................ | H01G 4/30 361/301.4 |
| 2015/0194264 A1 | 7/2015 | Engel et al. | | |
| 2015/0195878 A1 * | 7/2015 | Garrity | ............... | H05B 33/0815 315/186 |
| 2015/0294792 A1 * | 10/2015 | Schossmann | ............ | H01G 4/30 361/301.4 |
| 2015/0316926 A1 * | 11/2015 | Ziarno | ............... | G05B 23/0213 701/3 |
| 2015/0330869 A1 * | 11/2015 | Ziarno | .................. | G01M 15/14 701/34.4 |
| 2015/0363981 A1 * | 12/2015 | Ziarno | ................ | H04B 1/3822 701/101 |
| 2016/0021748 A1 * | 1/2016 | Kageyama | ........... | H05K 1/0215 361/767 |
| 2016/0029447 A1 * | 1/2016 | Ido | ........................ | H05B 33/083 315/201 |
| 2016/0050759 A1 | 2/2016 | Park | | |
| 2016/0141106 A1 * | 5/2016 | Perea | ........................ | H01C 1/14 29/25.41 |
| 2016/0307701 A1 * | 10/2016 | Park | ..................... | H01G 4/1218 |

FOREIGN PATENT DOCUMENTS

| | | |
|---|---|---|
| DE | 102012104033 A1 | 11/2013 |
| DE | 102012111023 A1 | 5/2014 |
| DE | 102013101323 B4 | 12/2015 |
| DE | 102015102866 A1 | 9/2016 |
| GB | 2030780 A | 4/1980 |
| JP | S55-96622 A | 7/1980 |
| JP | H03-113525 U | 11/1991 |
| JP | H11-340079 A | 12/1999 |
| JP | 2010-523429 A | 7/2010 |
| JP | 2015-516112 A | 6/2015 |
| JP | 2015-527735 A | 9/2015 |
| JP | 2015-535145 A | 12/2015 |
| JP | 2017-201703 A | 11/2017 |

(56) References Cited

FOREIGN PATENT DOCUMENTS

| | | |
|---|---|---|
| WO | WO 2008/135466 A1 | 11/2008 |
| WO | WO 2013/152887 A1 | 10/2013 |
| WO | WO 2014/075846 A1 | 5/2014 |

* cited by examiner

FILTER COMPONENT FOR FILTERING AN INTERFERENCE SIGNAL

CROSS-REFERENCE TO RELATED APPLICATIONS

This application is a U.S. National Stage of International Application No. PCT/EP2017/064298, filed Jun. 12, 2017, which claims the benefit of Germany Patent Application No. 102016110742.5, filed Jun. 10, 2016, both of which are incorporated herein by reference in their entireties.

The present invention relates to a filter component for filtering an interference signal, in particular an EMI (electromagnetic interference) filter component. Filters of this type are configured for example for use in the automotive field, in particular in the case of hybrid and electric vehicles (xEV). A filter component is known for example from the document DE 10 2013 101 323 B4.

In a high-temperature embodiment, such as e.g. in an xEV application, a high thermal stability of the filter components, in particular of the capacitors, is necessary. The filter component should be suitable in particular for use at temperatures of 150° C. or higher. Moreover, the capacitors should have a high robustness vis-à-vis moisture, relatively high capacitance values and a small installation size.

These properties can be achieved only with difficulty with film capacitators that are often used for high-voltage EMI filters. Film capacitors often have a large installation size or require cooling in order to keep the temperature at an acceptable level. Most ceramic capacitors, too, do not have the properties desired for use in EMI filters, such as high thermal stability, good filter capability and mechanical robustness in conjunction with the capacitance values required at the same time.

It is an object of the present invention to specify a filter component having improved properties.

The filter component according to the invention comprises at least one multilayer ceramic capacitor (MLCC). The multilayer capacitor comprises a main body, in which a plurality of ceramic layers and internal electrodes are stacked one above another. Connection contacts are arranged at the main body, in particular at opposite sides of the main body.

The main body can also be composed of a plurality of partial bodies that are interconnected in parallel with one another, for example. The partial bodies are arranged for example between two common connection contacts.

In one embodiment, the ceramic layers comprise a modified lead zirconate titanate (PZT) ceramic. By way of example, the ceramic layers can comprise a lead lanthanum zirconate titanate (PLZT) ceramic.

The composition of the ceramic is chosen in particular in such a way that the ceramic has an anti-ferroelectric behavior. In the case of an anti-ferroelectric behavior, the dielectric constant rises as the electric field strength increases. The dielectric constant assumes in particular a maximum at a value of the electric field strength of greater than zero and then falls again as the electric field strength increases. Accordingly, the electrical capacitance of the multilayer capacitor in a voltage range greater than zero rises as the electrical voltage increases.

By way of example, the capacitance rises at least in a range of 200 volts to 300 volts. The capacitance assumes for example a maximum in a range of between 300 V and 1000 V and then falls again.

Capacitors of this type had already been developed for use in DC link and snubber applications. The current-carrying capacity is of primary importance in these applications. It has now been found, surprisingly, that a capacitor of this type also has particularly advantageous properties for use in an EMI filter. In this field of application, what is demanded is not so much a high current-carrying capacity, but rather a high dielectric strength, in particular at high temperatures. By way of example, the capacitor should permit voltage peaks of up to 2000 V, in particular up to 2500 V.

It has been found that the requirements in respect of the dielectric strength in the case of EMI filters, for example according to a customary X or Y classification, can be met with a capacitor of this type.

In DC link and snubber applications, the capacitor is usually operated at the switching field, i.e. at the maximum of the capacitance. The capacitor described was thus originally developed to be operated at the switching field. In the case of use as an EMI filter, the capacitor in accordance with preferred embodiments is operated significantly below the switching field, that is to say in a range for which the capacitor was not developed. By way of example, the operating voltage is at most half the magnitude of the voltage at the maximum of the capacitance. In particular, the capacitor is operated at relatively low fields or voltages.

By way of example, the capacitor is operated in a range of 300 to 500 V DC voltage, in particular at 400 V DC voltage. The maximum is for example at above 1000 V, for example at 1500 V.

This has a positive effect on the lifetime at high temperatures. At the same time the capacitor can be operated in a low-loss range.

In one embodiment, the capacitor has at least one external electrode which is arranged on an outer side of the main body and to which the connection contact is secured. By way of example, the external electrode comprises at least one sputtered layer. The external electrode can be applied directly on the ceramic. In one embodiment, the external electrode has a multilayered construction. In the case of a multilayered construction, the individual layers can be optimized with regard to their adhesive strength to the ceramic, their property as a diffusion barrier, and with regard to fitting a further contact. By way of example, the sputtered external electrode has a Cr/Ni/Ag layer construction.

In one embodiment, at least one of the connection contacts is formed from a metal sheet. In particular, it is a leadframe. The connection contacts can have connection regions configured for electrical and/or mechanical connection of the capacitor to a carrier, for example a printed circuit board. The connection contacts have a bent shape, for example. In particular, the connection regions are bent inward or outward in relation to a plane view of the main body.

In one embodiment, the connection contacts can have an interrupted structure. By way of example, the connection contacts can be configured in meandering fashion. The connection contacts can also have regions in the form of contact fingers.

In one embodiment, at least one of the connection contacts comprises a material having a low coefficient of thermal expansion, for example Invar. The connection contact can also have a multilayered construction. By way of example, the connection contact has a CIC (copper-Invar-copper) layer construction.

In one embodiment, at least one of the connection contacts is secured to the main body by a sintered connecting material. For this purpose, the connecting material is applied as paste on the main body and/or the connection contact. The paste contains silver, for example. Afterward, the connection contact is arranged at the main body and the arrangement is heated. In particular, a low-temperature sintering process is carried out in which the temperature is between 150° C. and 350° C., for example.

In one embodiment, the multilayer capacitor comprises first internal electrodes, which are connected to a first connection contact, second internal electrodes, which are connected to a second connection contact, and third internal electrodes, which are connected to none of the connection contacts.

Such an internal construction of the capacitor corresponds to a series connection of two capacitors. The capacitor can therefore also be referred to as a serial capacitor (MLSC, Multi Layer Serial Ceramic Capacitor). The dielectric strength of the capacitor can be increased by means of a series connection.

Instead of or in addition to an internal serial interconnection, it is also possible for a plurality of such capacitors to be interconnected in series with one another in order to increase the dielectric strength. In accordance with one aspect of the invention, a capacitor arrangement is specified in which two or more capacitors of this type are interconnected in series with one another. The capacitors can be interconnected with one another via resistors.

In one embodiment, at least one load relief region for mechanical load relief of the multilayer capacitor is formed in the main body. In the load relief region the ceramic layers are for example not connected to one another or are connected to one another only with low strength. The load relief region can be configured as a gap between the layers.

The multilayer capacitor is secured to a printed circuit board, for example. By way of example, the connection contacts can be connected to the printed circuit board by a sintered connecting material or by a solder material.

In one embodiment, the filter component comprises at least one busbar. The busbar can comprise two end sections projecting from a housing of the filter component. A central section of the busbar is arranged in the housing, for example. In particular, the filter component comprises at least two busbars of this type.

For connecting the filter component to electrical conductors, the busbars have for example connections at their end sections. By means of the connections the busbar can be connected for example to a supply voltage, for example to a battery, and a load.

By way of example, a printed circuit board on which the multilayer capacitor is arranged is secured to the busbar. In particular, the printed circuit board can be screwed to the busbar.

In one embodiment, the filter component comprises a housing, in particular a metal housing. The electrical component parts of the filter component are arranged within the housing. The housing serves for electromagnetic shielding, in particular.

The filter component can comprise one or a plurality of the multilayer capacitors described above. The multilayer capacitor is interconnected for example in an LC stage. The multilayer capacitor can be interconnected with respect to ground and/or be interconnected between connections to a voltage supply and connections to a load. A high dielectric strength is required in particular in the case of an interconnection relative to ground.

In accordance with a further aspect of the present invention, a use of a multilayer ceramic capacitor in a filter component for filtering an interference signal is specified. The multilayer capacitor and the filter component can be configured as described above. In particular, the multilayer capacitor comprises a main body, in which a plurality of ceramic layers and internal electrodes are stacked one above another, wherein connection contacts are arranged at the main body. By way of example, the ceramic layers comprise a lead lanthanum zirconate titanate ceramic.

In accordance with one embodiment of the use of the multilayer ceramic capacitor for filtering an interference signal, the multilayer capacitor is operated at an operating voltage that is significantly below the voltage at which the capacitor has a maximum in the capacitance. During operation of this type, the capacitance is thus below the maximum, but this is sufficient for operation as an EMI filter. The breakdown voltage and lifetime are increased as a result of the operation below the maximum.

By way of example, the operating voltage is at most half the magnitude of the voltage at the maximum.

Overall the described capacitor in the case of use as an EMI filter, on account of its high capacitance density, enables a highly compact design together with high thermal stability, long lifetime and high dielectric strength.

A plurality of aspects of an invention are described in the present disclosure. All properties which are disclosed with respect to the filter component and the use of a multilayer capacitor are also correspondingly disclosed with respect to the other aspects, even if the respective property is not explicitly mentioned in the context of the other aspects. Moreover, the description of the subjects specified here is not restricted to the individual specific embodiments. Rather, the features of the individual embodiments, in so far as is technically practical, can be combined with one another.

The subjects described here are explained in greater detail below on the basis of schematic exemplary embodiments.

In the figures.

Preferably, in the following figures, identical reference signs refer to functionally or structurally corresponding parts of the different embodiments.

Figure 1:
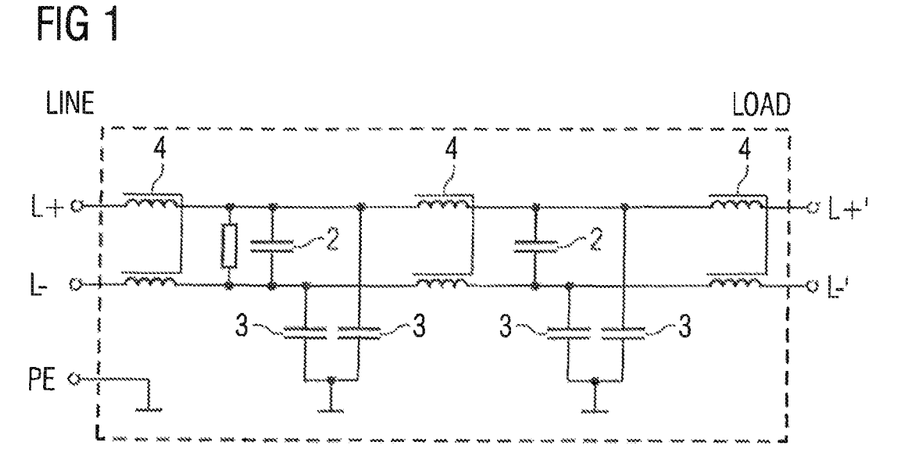
FIG. 1 shows an exemplary circuit diagram of an EMI filter.

FIG. 1 shows an exemplary circuit diagram of an EMI filter 1, in particular of a DC EMI filter. A filter 1 of this type can also be referred to as an EMC (electromagnetic compatibility) filter. The filter 1 serves for filtering an interference signal that is transmitted together with a useful signal on an electrical line. In particular, it can be a high-voltage filter. By way of example, the filter 1 is configured for use in the automotive field, in particular in the case of hybrid and electric vehicles (xEV). The filter 1 can also be referred to as filter component 1.

The filter 1 comprises connections L+ and L− to a voltage supply (LINE) and connections L+' and L−' to a load (LOAD). The voltage supply is a high-voltage battery, for example. By way of example, the required voltage is 400 to 100 VDC. The load is the drive unit of a vehicle, for example. Furthermore, the filter 1 comprises a connection PE to a protective line or ground or housing.

The filter 1 comprises a plurality of first and second capacitors 2, 3. The first capacitors 2 are interconnected between the connections L+, L−, L+' and L−'. The second capacitors 3 are interconnected with respect to ground. Moreover, the filter 1 comprises a plurality of inductances 4 having magnet cores.

The electrical component parts of the filter 1, in particular capacitors 2, 3 and inductances 4, can be arranged for shielding in a housing.

In a high-temperature environment, such as e.g. in an xEV application, a high thermal stability of the filter 1 is necessary. The component parts, in particular the capacitors 2 and 3, should still be reliably usable at temperatures of greater than 85° C. By way of example, the component parts should be usable at least up to a temperature of 125° C., preferably at least up to 150° C.

Required capacitance values for the first capacitors 2 are for example 100 nF to a few μF, and for the second capacitors 3 are a few nF to 1 μF, in particular 4.7 nF.

Figure 2:
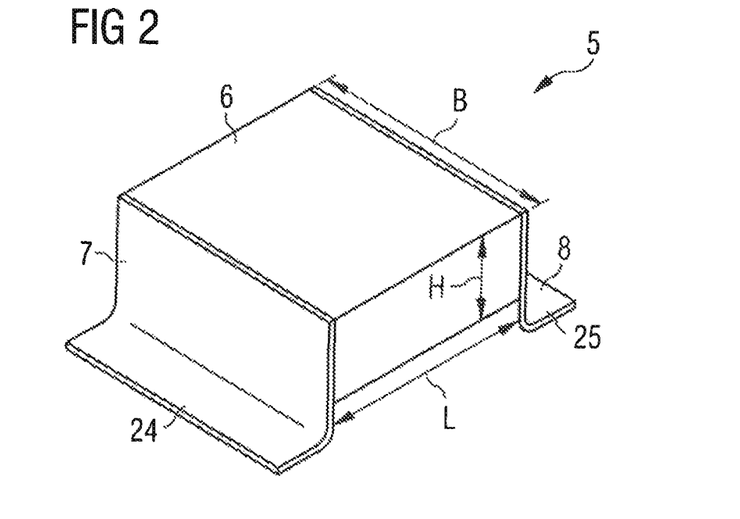
FIG. 2 shows a multilayer ceramic capacitor for an EMI filter in perspective view.

FIG. 2 shows one embodiment of a multilayer ceramic capacitor 5 suitable for use in a high-temperature EMI filter. By way of example, one or a plurality of the capacitors 2, 3 in the EMI filter 1 from FIG. 1 are configured as a multilayer ceramic capacitor 5 of this type.

The multilayer capacitor 5 comprises a main body 6. The main body 6 is configured as a ceramic chip. The main body 6 comprises a ceramic material.

By way of example, a ceramic material of the following formula is used:

$$Pb_{(1-1.5a-0.5b+1.5d+e+0.5f)}A_aB_b(Zr_{1-x}Ti_x)_{(1-c-d-e-f)}Li_dC_eF_{ef}Si_cO_3+y\cdot PbO,$$

wherein A is selected from a group consisting of La, Nd, Y, Eu, Gd, Tb, Dy, Ho, Er and Yb; B is selected from a group consisting of Na, K and Ag; C is selected from a group consisting of Ni, Cu, Co and Mn; and wherein it holds true that $0 < a < 0.12$; $0.05 \le x \le 0.3$; $b < 0.12$; $0 \le c < 0.12$; $0 \le d < 0.12$; $0 \le e < 0.12$; $0 \le f < 0.12$; $0 \le y < 1$, wherein $b+d+e+f > 0$.

By way of example, at least one of the following relationships holds true for the composition:

$0.1 < x < 0.2$;

$0.001 < b < 0.12$; and preferably $d = e = f = 0$;

$0.001 < e < 0.12$; and preferably $b = d = f = 0$.

In particular, a PLZT (lead lanthanum zirconate titanate) ceramic can be used. In this case, therefore, A=La holds true in the formula above. Moreover, B=Na can hold true. By way of example, the material has the following composition:

The composition of the ceramic is chosen in particular in such a way that the ceramic has an anti-ferroelectric behavior. The anti-ferroelectric behavior is described in greater detail in association with FIG. 7.

Furthermore, the ceramic material has a high insulation capability at high temperature. By way of example, the following holds true for the product of insulation resistance $R_{is}$ and capacitance C: $R_{is} \times C > 1 \times 10^4 \Omega F$ at 150° C.

The multilayer capacitor 5 comprises two connection contacts 7, 8, which are arranged at opposite side surfaces of the main body 6. The connection contacts 7, 8 are each configured in the form of bent contact metal sheets (leadframes). The connection contacts 7, 8 are bent outward, i.e. in a direction away from the main body 6. This shape of the connection contacts 7, 8 is also referred to as an L-shape.

The connection contacts 7, 8 have connection regions 24, 25. The connection regions 24, 25 are arranged laterally with respect to the main body 6 in plan view.

The connection contacts 7, 8 are configured for example for SMD mounting. By way of example, the connection contacts 7, 8, in particular the connection regions 24, 25, are connected to a printed circuit board by soldering. The connection regions 24, 25 are arranged at a distance from an underside of the main body 6 in a height direction, such that a free space is formed between the main body 6 and the printed circuit board. This enables improved heat dissipation.

The printed circuit board is connected, in particular screwed, for example to a busbar of the EMI filter. The connection contacts 7, 8 comprise for example copper and/or a multilayered metal composite.

The main body 6 has a length L, a height H and a width B. The length L is the extent of the main body 6 from a connection contact 7 to the opposite connection contact 8, the height H is the extent perpendicular to a printed circuit board and the width B is the extent in a direction perpendicular to the height H and perpendicular to the length L. By way of example, the height H is significantly less than the width B and the length L. By way of example, the length L is in the range of 6.0 mm to 8.0 mm. In particular, the length L can be 7 mm. By way of example, the width B is in the range of 7.0 mm to 9.0 mm. In particular, the width B can be 8 mm. By way of example, the height H is in the range of 2.0 and 4.0 mm. In particular, the height H can be 3.0 mm.

The capacitors 2, 3 from FIG. 1 can also each comprise a plurality of ceramic bodies interconnected with one another. For this purpose, by way of example, a plurality of main bodies are arranged between two connection contacts (leadframes) and interconnected to form a capacitor unit.

Figure 3:
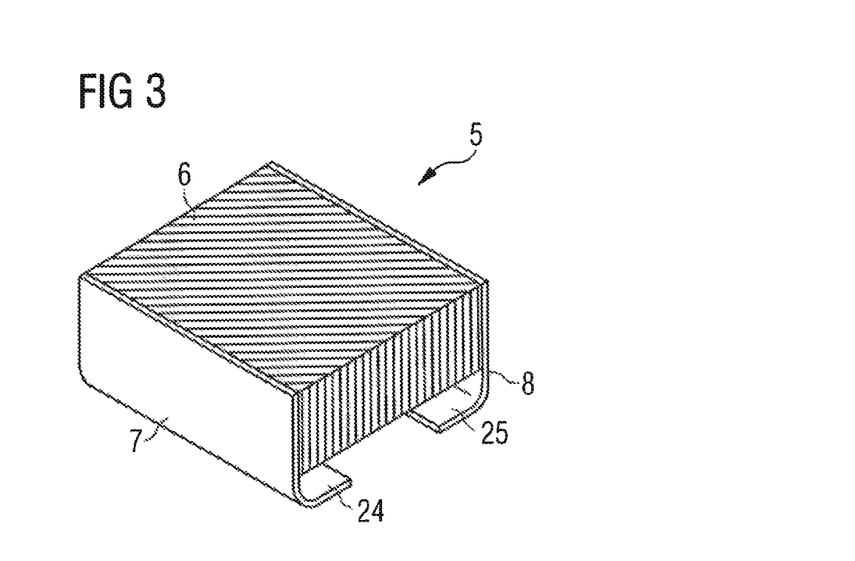
FIG. 3 shows a further multilayer ceramic capacitor for an EMI filter in perspective view.

FIG. 3 shows a further embodiment of a multilayer ceramic capacitor 5 for an EMI filter, in which, in contrast to the multilayer capacitor from FIG. 2, the connection contacts 7, 8 are bent inward. The connection regions 24, 25 are situated below the main body 6 in plan view. The connection regions 24, 25 are at a distance from the main body 6 in the height direction. This shape of the connection contacts 7, 8 can be referred to as a J-shape.

Figure 4:
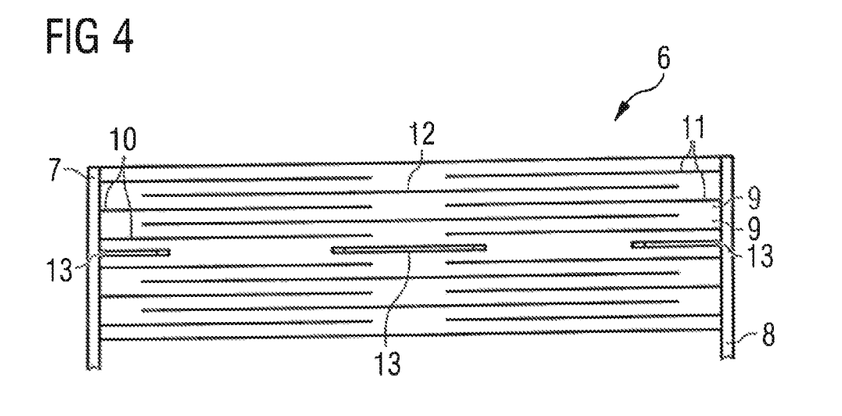
FIG. 4 shows a main body of a multilayer ceramic capacitor for an EMI filter in sectional view.

FIG. 4 shows the main body 6 in a sectional view. The main body 6 has a plurality of ceramic layers 9 and internal electrodes 10, 11, 12. Preferably, all the ceramic layers 9 and internal electrodes 10, 11, 12 are sintered jointly. The ceramic layers 9 have the composition described above. The internal electrodes 10, 11, 12 comprise copper or consist of copper with a high degree of purity.

The first internal electrodes 10 are led as far as a side surface of the main body 6 and are electrically connected there to the first connection contact 7. The second internal electrodes 11 are led as far as an opposite side surface of the main body 6 and are electrically connected to the second connection contact 8.

The first internal electrodes 10 are arranged in each case with a second internal electrode 11 on a common ceramic layer 9. Consequently, a first internal electrode 10 and a second internal electrode 11 are arranged in each case at the same height of the main body 6. The first internal electrodes 10 and the second internal electrodes 11 do not overlap in orthogonal projection.

The third internal electrodes 12 are configured as so-called floating electrodes. The third internal electrodes 12 are electrically connected to none of the connection contacts 7, 8. The third internal electrodes 12 overlap the first and second internal electrodes 10, in orthogonal projection. The third internal electrodes 12 are arranged, in the stacking direction, alternately with the first and second internal electrodes 10, 11 situated on a common layer 9.

The internal electrodes 10, 11 of opposite polarities are not led as far as a common side surface of the main body 6.

The arrangement of the internal electrodes 10, 11, 12 and in particular the configuration of the floating internal electrodes 12 enable a particularly high capacitance density of the multilayer capacitor 5. Consequently, high capacitance values can be achieved in conjunction with a small structural size. By way of example, given an operating voltage of 400 $V_{DC}$, it is possible to achieve capacitances of up to 1 µF. Furthermore, the dielectric strength can be increased by this design. On account of the design, the ceramic layers 9 can have a smaller thickness and it is possible to achieve a higher breakdown strength.

The main body 6 has one or more load relief regions 13, in which the ceramic layers 9 are not connected to one another. The load relief regions 13 serve for mechanical load relief of the multilayer capacitor 5 and thus contribute to increasing the mechanical stability. In particular, mechanical stresses can be reduced by the load relief regions 13. The load relief regions 13 can be formed circumferentially along the side surfaces of the main body 6.

Figure 5:
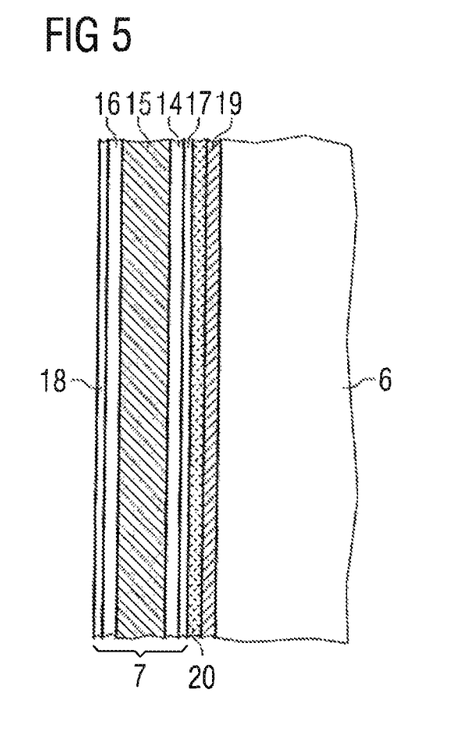
FIG. 5 shows a linking of a connection contact to a main body of a multilayer ceramic capacitor for an EMI filter in sectional view.

FIG. 5 shows an enlarged excerpt from FIG. 2 or 3, in which the securing of the first connection contact 7 to the main body 6 and the construction of the connection contact 7 can be seen in detail.

The connection contact 7 has a multilayered construction. A first layer 14 comprises a first material having a particularly good electrical and thermal conductivity. This is copper, for example. The connection contact has a second layer 15 composed of a second material. The second material has a low coefficient of thermal expansion. Furthermore, the second layer 15 ensures for example the mechanical strength of the connection contact 7. By way of example, the second material is Invar, a specific iron-nickel alloy.

The connection contact 7 can additionally have a third layer 16. The third layer 16 can comprise the same material as the first layer 14. A bimetallic behavior of the connection contact 7 can be prevented by the third layer 16.

In particular, the connection contact 7 can have a CIC (copper-Invar-copper) layer construction.

The second layer 15 is for example significantly thicker than the first layer 14 and the third layer 16. By way of example, the third layer 16 has the same thickness as the first layer 14. By way of example, the second layer 15 has a thickness of 90 µm, the first layer 14 has a thickness of 30 µm and the third layer 16 has a thickness of 30 µm.

The connection contact 7 can furthermore have one or more further layers 17, 18. The further layers 17, 18 form for example the outer sides of the connection contact 7. By way of example, electroplating layers these can be silver layers. The electroplating layers each have for example a thickness in the range of 5 µm to 10 µm. The further layers 17, 18 serve for example for passivation for the first and third layers 14, 16, respectively. In particular, these layers can provide start-up protection. Furthermore, these layers can provide solderable surfaces or improve the connection to a sintering material.

In order to produce a connection contact 7, by way of example, the second layer 15 is provided and then there is arranged thereon the first layer 14 and, if appropriate, the third layer 16. The second layer 15 is provided in particular as a metal sheet. By way of example, the first and third layers 14 and 16 are rolled onto the second layer 15. Afterward, the electroplating layers 17, 18 are applied for example on both sides. From the multilayered metal sheet, for example, a piece is then stamped out and bent into a desired shape.

The connection contact 7 is preferably secured to an external electrode 19 of the main body 6. The external electrode 19 directly adjoins the ceramic of the main body 6. The external electrode 19 comprises at least one sputtered layer, for example. The external electrode 19 can comprise a plurality of layers arranged one above another, in particular a plurality of sputtered layers. By way of example, a Cr/Ni/Ag layer construction can be involved. By way of example, the external electrode 19 has a thickness in the region of 1 µm.

The connection contact 7 is connected to the external electrode 19 by a connecting material 20. The connecting material 20 should have a high electrical and thermal conductivity. Furthermore, the connecting material 20 should have a high robustness vis-à-vis cyclic thermal loads and a high adhesive strength. By way of example, the connecting material 20 comprises a sintering material, in particular sintering silver. The connection contact 7 is then secured to the main body 6 by sintering, in particular low-temperature sintering, of the connecting material 20. In this case, sintering is understood to mean connecting whilst avoiding the liquid phase of the connecting material 20. The sintering is thus carried out as a diffusion process.

By way of example, the sintering is carried out at a temperature of between 150° C. and 350° C., in particular between 200° C. and 300° C. By way of example, the connecting material 20 has a thickness in the region of 20 µm.

Figure 6:
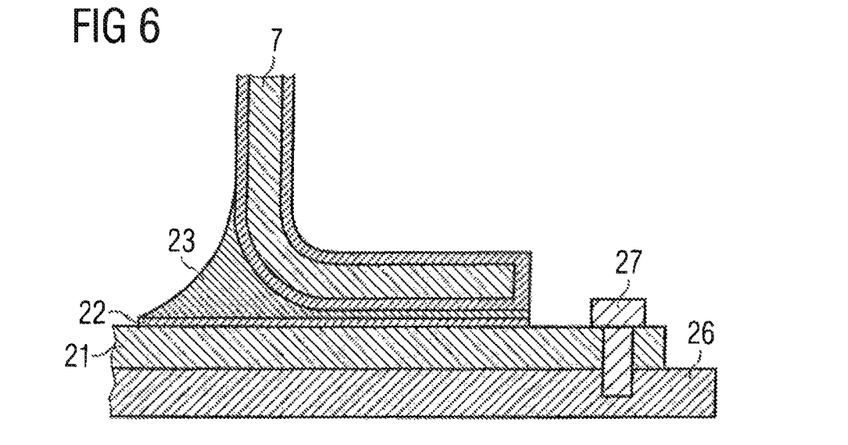
FIG. 6 shows a linking of a connection contact of a multilayer ceramic capacitor for an EMI filter to a printed circuit board and a busbar in sectional view.

FIG. 6 shows an excerpt from a securing of a connection contact 7 of a multilayer capacitor 5 (FIGS. 2 and 3) to a printed circuit board 21 and a busbar 26. The connection contact 7 is configured for example as in FIG. 5. Not all possible layers of the connection contact 7 are illustrated, for reasons of clarity.

The printed circuit board 21 is configured for example as an FR4 or ceramic substrate. The printed circuit board is connected to a busbar 26 of the EMI filter for example by means of a screw 27. The busbar 26 is configured for example as a metal sheet.

The printed circuit board 21 has a contact region 22, to which the connection contact 7 is secured. By way of example, the contact region 22 is a soldering connection contact, a Cu contact or an Ni—Au contact. The connection contact 7 is sintered or soldered to the contact region by means of a connecting material 23. By way of example, sintering silver or an SAC solder is used as connecting material 23.

Overall the multilayer capacitor 5 described above has a high thermal stability and a high robustness vis-à-vis moisture on account of its structural construction and its material.

No additional sealing of the capacitor 5 is necessary, which contributes to the small installation size.

Figure 7:
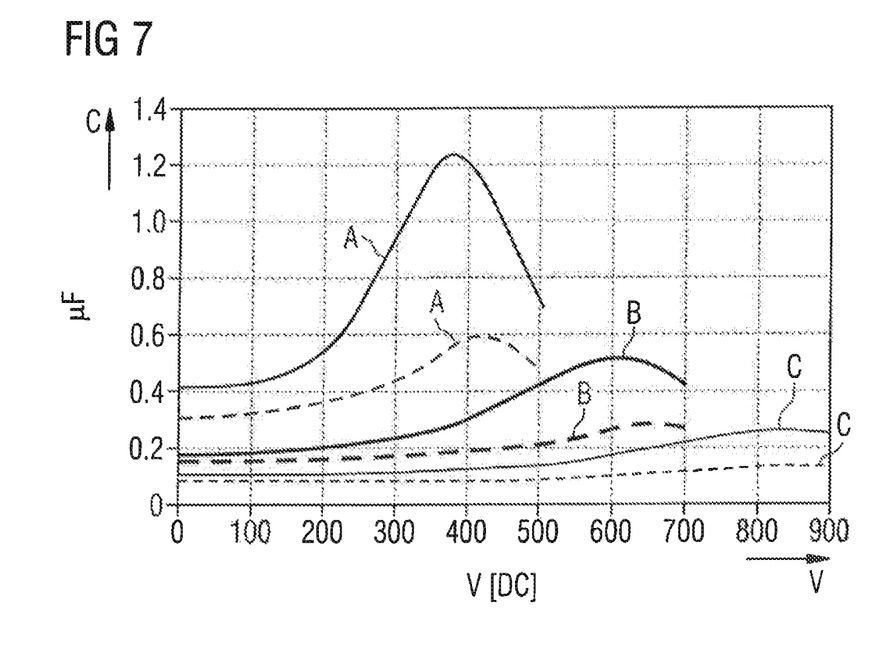
FIG. 7 shows a capacitance-voltage diagram of a multilayer ceramic capacitor for an EMI filter.

FIG. 7 shows a profile of the capacitance C as a function of a DC voltage $V_{DC}$ for a multilayer capacitor for an EMI filter, for example in accordance with FIG. 3 or FIG. 4. The measurements were carried out for different layer thicknesses A, B, C of the dielectric. In this case, the solid lines are the measurement results for quasi-static hysteresis measurement, and the dashed lines at 1 kHz, 0.5 V.

The multilayer capacitors have an anti-ferroelectric behavior. The capacitance rises as the voltage increases. The capacitance reaches a maximum and then falls again.

For the ceramic material the dielectric constant behaves correspondingly as a function of the electric field. In the case of a ferroelectric behavior, the capacitance decreases beginning at V=0.

The rise in the capacitance as the voltage increases takes place for example at least in a voltage range of between 200 V and 300 V. For all layer thicknesses A, B, C, as the voltage increases further the capacitance reaches a maximum and then decreases again. The maxima of the capacitances for all layer thicknesses A, B, C form at the same electric field strength, but at different voltages.

Figure 8:
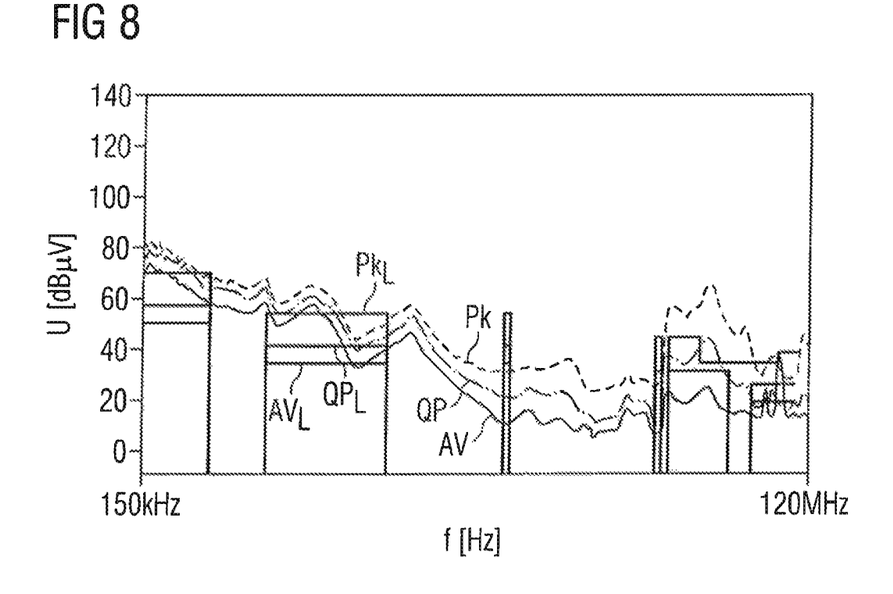
FIG. 8 shows an interference voltage curve of power electronics filtered with an EMI filter comprising a multilayer ceramic capacitor.

FIG. 8 shows an interference voltage curve of an EMI filter comprising the multilayer capacitor 5 described above. The EMI filter has the construction from FIG. 1. Alternatively, the EMI filter can also be configured just as an LC stage having one inductance 4 and second capacitors 3.

The measurements were carried out in accordance with the CISPR 25 standard. A peak (Pk), a quasi-peak (QP) and an average value (AV) measurement were carried out. The interference voltage U in dBpV is plotted against the frequency f in Hz. The respective limit values $Pk_L$, $AV_L$ and $QP_L$ are additionally depicted.

As can be seen in the diagram, the EMI filter has good filter properties in the entire frequency range, i.e. from the long-wave range to the VHF range.

It has been found that, in particular, the capacitor from EPCOS AG sold under the product designation "CeraLink" is suitable for use in a DC EMI filter. By way of example, a CeraLink capacitor of the LP series (see, for example, product data sheet, version as of Feb. 8, 2016) can be used here. This capacitor was originally developed for DC link or snubber applications, and so the capacitor is optimized for high capacitor currents.

It has now been found, surprisingly, that a capacitor of this type is also suitable for use in DC EMI filters and has particularly advantageous properties for this field of application as well. In the case of use in an EMI filter, the current-carrying capacity is rather of secondary importance. The capacitor should rather have a high dielectric strength, in particular even at high temperatures. This is the case for the CeraLink capacitor.

Figure 9:
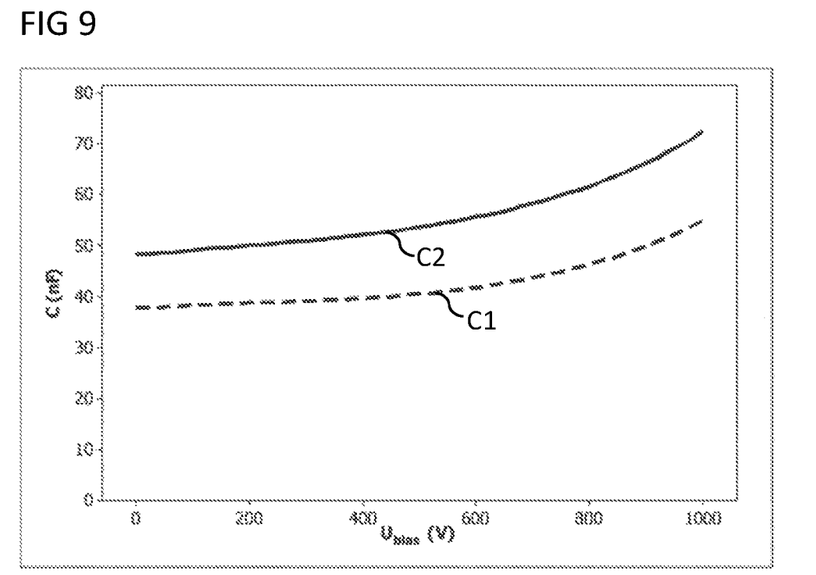
FIG. 9 shows a capacitance-voltage diagram of two multilayer ceramic capacitors in the case of operation as an EMI filter.

FIG. 9 shows a capacitance-voltage diagram of two of the above-described multilayer ceramic capacitors C1, C2 in the case of operation as an EMI filter.

The multilayer capacitors C1, C2 differ in their ceramic. The multilayer capacitor C1 comprises the material $Pb_{0.87}La_{0.07}Na_{0.05}Zr_{0.86}Ti_{0.14}O_3$. The multilayer capacitor C2 comprises the material $Pb_{0.881}La_{0.06}Na_{0.058}Zr0.90Ti_{0.10}O_3$.

In the case of use as an EMI filter, the capacitors C1, C2 are operated far below the switching field. By way of example, the applied DC voltage $U_{bias}$ is 400 V. The maximum of the capacitance is significantly higher, for example 1500 V.

The capacitance C is somewhat below 40 nF for C1, and approximately 50 nF for C2. By adapting the ceramic material, the capacitance can thus be set to a required value.

Figure 10:
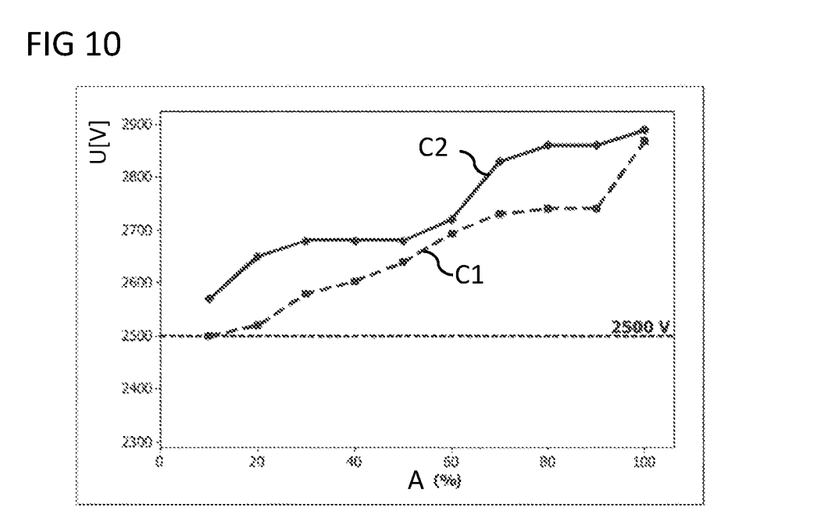
FIG. 10 shows a voltage-failure diagram of two multilayer ceramic capacitors in the case of operation as an EMI filter.

FIG. 10 shows a voltage-failure diagram of the multilayer ceramic capacitors C1, C2 from FIG. 9 in the case of voltage spikes. The voltage U is plotted against the failures A in %.

A dielectric strength of 2500 V is achieved for both capacitors. In this case, the capacitor C2 has a higher dielectric strength than the capacitor C1.

The lifetime can also be increased by using thicker ceramic layers, such that the layer thickness can also be optimized for adapting the lifetime.

Figure 11:
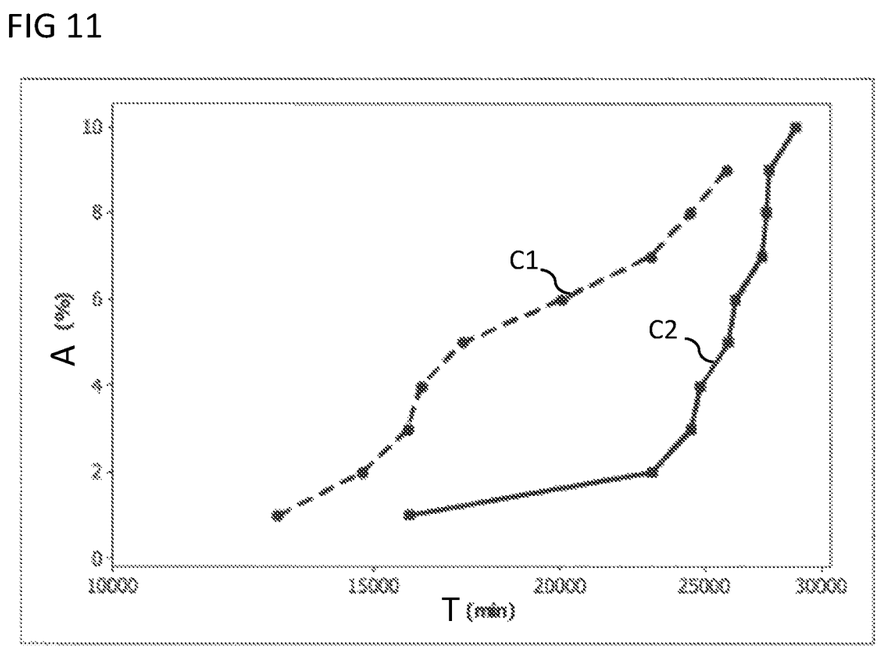
FIG. 11 shows a failure-time diagram of two multilayer ceramic capacitors in the HAL test.

FIG. 11 shows a failure-time diagram of the multilayer ceramic capacitors C1, C2 from FIG. 9 in the HAL test (highly accelerated life-test) at a temperature of 200° C. and a voltage of 1200 V. The failures A in % are plotted against the time T in minutes. The capacitor C2 has a longer lifetime.

LIST OF REFERENCE SIGNS

1 Filter/filter component
2 First capacitor
3 Second capacitor
4 Inductance
5 Multilayer capacitor
6 Main body
7 First connection contact
8 Second connection contact
9 Ceramic layer
10 First internal electrode
11 Second internal electrode
12 Floating internal electrode
13 Load relief region
14 First layer
15 Second layer
16 Third layer
17 Further layer
18 Further layer
19 External electrode
20 Connecting material
21 Printed circuit board
22 Contact region
23 Connecting material
24 First connection region
25 Second connection region
26 Busbar
27 Screw
L+ Connection to voltage supply
L− Connection to voltage supply
L+' Connection to load
L−' Connection to load
PE Connection to protective line
Pk Peak
QP Quasi-peak
AV Average value
$Pk_L$ Limit value for Pk
$QP_L$ Limit value for QP
$AV_L$ Limit value for AV
C1 Capacitor comprising first material
C2 Capacitor comprising second material

The invention claimed is:

1. A filter component for filtering an interference signal, comprising at least one multilayer ceramic capacitor having a main body, in which a plurality of ceramic layers and internal electrodes are stacked one above another, wherein connection contacts are arranged at the main body, wherein a ceramic material of the ceramic layers is of the formula wherein A is selected from a group consisting of La, Nd, Y, Eu, Gd, Tb, Dy, Ho, Er and Yb; B is selected from a group consisting of Na, K and Ag; C is selected from a group consisting of Ni, Cu, Co and Mn; wherein:
$0<a<0.12$;
$0.05 \leq x \leq 0.3$;
$0 \leq b<0.12$;
$0 \leq c<0.12$;
$0 \leq d<0.12$;
$0 \leq e<0.12$;
$0 \leq f<0.12$;
$0 \leq y<1$; and wherein
$b+d+e+f>0$.

2. The filter according to claim 1, wherein the electrical capacitance of the multilayer capacitor in a voltage range greater than zero rises as the electrical voltage increases.

3. The filter according to claim 1, wherein the ceramic layers comprise a lead lanthanum zirconate titanate ceramic.

4. The filter component according to claim 1, wherein at least one of the connection contacts comprises Invar.

5. The filter component according to claim 1, wherein at least one of the connection contacts is secured to the main body by a sintered connecting material.

6. The filter component according to claim 1, wherein an external electrode is arranged on at least one outer side of the main body, wherein the external electrode comprises at least one sputtered layer.

7. The filter component according to claim 1, wherein the multilayer capacitor comprises first internal electrodes, which are electrically connected to a first connection contact, second internal electrodes, which are connected to a second connection contact, and third internal electrodes, which are connected to none of the connection contacts.

8. The filter component according to claim 1, wherein at least one load relief region for mechanical load relief is formed in the main body.

9. The filter component according to claim 1, comprising a printed circuit board, wherein the connection contacts are connected to the printed circuit board by a sintered connecting material.

10. The filter component according to claim 9, comprising a busbar, wherein the printed circuit board is screwed to the busbar.

11. The filter component according to claim 1, wherein the multilayer ceramic capacitor is interconnected between first connections to a voltage supply and second connections to a load.

12. The filter component of claim 1, wherein at least one of the connection contacts comprises a layered structure of copper-Invar-copper.

13. The filter component according to claim 1, wherein at least one of the connection contacts is a lead frame.

14. The filter component according to claim 1, wherein the connection contact is configured in meandering fashion.

15. The filter component according to claim 1, which is suitable to be used at a temperature of 150° C. or higher.

* * * * *